(12) United States Patent
Bashore et al.

(10) Patent No.: US 10,204,194 B2
(45) Date of Patent: Feb. 12, 2019

(54) MEMORY FRAME PROXY ARCHITECTURE FOR SYNCHRONIZATION AND CHECK HANDLING IN A SIMULATOR

(71) Applicant: INTERNATIONAL BUSINESS MACHINES CORPORATION, Armonk, NY (US)

(72) Inventors: Tracy Bashore, Rochester, MN (US); Ahmed Gheith, Austin, TX (US); Aditya Kumar, Austin, TX (US); Andrew R. Malota, Austin, TX (US); Ronald L. Rockhold, Satellite Beach, FL (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 389 days.

(21) Appl. No.: 15/013,380

(22) Filed: Feb. 2, 2016

(65) Prior Publication Data
US 2016/0147922 A1    May 26, 2016

Related U.S. Application Data

(63) Continuation of application No. 13/707,812, filed on Dec. 7, 2012, now Pat. No. 9,336,341.

(51) Int. Cl.
*G06F 9/455* (2018.01)
*G06F 17/50* (2006.01)
*G06F 11/36* (2006.01)

(52) U.S. Cl.
CPC ...... *G06F 17/5022* (2013.01); *G06F 11/3632* (2013.01); *G06F 17/5009* (2013.01)

(58) Field of Classification Search
CPC ............. G06F 9/45558; G06F 9/45533; G06F 9/5077; G06F 2009/4557; G06F 9/455;
(Continued)

(56) References Cited

U.S. PATENT DOCUMENTS 5,440,727 A    8/1995    Bhide et al.
5,617,553 A    4/1997    Minigawa et al.
(Continued)

OTHER PUBLICATIONS

Office Action in U.S. Appl. No. 13/707,812 dated Oct. 7, 2015, 15 pages (pp. 1-15 in pdf).
(Continued)

*Primary Examiner* — Aniss Chad
*Assistant Examiner* — Cuong V Luu
(74) *Attorney, Agent, or Firm* — Mitch Harris, Atty at Law, LLC; Andrew M. Harris; Joseph J. Petrokaitis (57) ABSTRACT

A simulation technique that handles accesses to a frame of memory via a proxy object provides improved throughput in simulation environments. The proxy object, if present, processes the access at a head of a linked list of frames. If a check frame is not inserted in the list, the memory frame handles the request directly, but if a check frame is inserted, then the check operation is performed. The check frame can be a synchronization frame that blocks access to a memory frame while the check frame is present, or the check frame may be a breakpoint, watch or exception frame that calls a suitable handling routine. Additional check frames may be chained between the interface and the memory subsystem to handle synchronization, breakpoints, memory watches or other accesses to or information gathering associated with the memory frame.

12 Claims, 6 Drawing Sheets

(58) Field of Classification Search
CPC ............. G06F 9/5072; G06F 2201/815; G06F 3/0484; G06F 2009/45579; G06F 21/10; G06F 2009/45595; G06F 8/61; G06F 9/54; G06F 11/3409; G06F 21/57; G06F 9/44; G06F 3/0665; G06F 9/5027; G06F 3/065; G06F 9/4445; G06F 11/1484; G06F 9/5088; G06F 9/45504; G06F 2009/45575; G06F 11/1464; G06F 3/0685; G06F 9/445; G06F 9/45545; G06F 2212/151; G06F 17/5009; G06F 2221/034; G06F 2212/152; G06F 2212/657; G06F 3/0644; G06F 12/023; G06F 9/3004; G06F 11/3485; G06F 9/467; G06F 12/0802; G06F 9/3834; G06F 12/123; G06N 3/10; G06N 7/06
See application file for complete search history.

(56) References Cited

U.S. PATENT DOCUMENTS

| | | | |
|---|---|---|---|
| 5,895,490 A | 4/1999 | Ramsey | |
| 7,165,201 B2 | 1/2007 | Groz et al. | |
| 7,184,944 B1 | 2/2007 | Rieschl et al. | |
| 7,356,653 B2* | 4/2008 | von Praun | G06F 9/52 711/147 |
| 7,596,654 B1 | 9/2009 | Wong | |
| 7,818,513 B2 | 10/2010 | Moir | |
| 7,877,659 B2 | 1/2011 | Gellar et al. | |
| 8,086,438 B2 | 12/2011 | Nohl et al. | |
| 8,090,935 B2 | 1/2012 | Anwar et al. | |
| 8,103,838 B2 | 1/2012 | Dice et al. | |
| 8,209,499 B2 | 1/2012 | Chou | |
| 8,209,689 B2 | 1/2012 | Raikin et al. | |
| 8,296,551 B2* | 10/2012 | Bugnion | G06F 9/45504 712/244 |
| 8,457,943 B2 | 6/2013 | Wang et al. | |
| 8,473,921 B2 | 6/2013 | Taillefer et al. | |
| 8,688,432 B2 | 4/2014 | Gheith et al. | |
| 8,813,079 B1* | 8/2014 | Lindo | G06F 9/526 718/100 |
| 9,009,020 B1* | 4/2015 | Oskin | G06F 9/455 703/22 |
| 2005/0015754 A1 | 1/2005 | Werner et al. | |
| 2008/0104595 A1* | 5/2008 | Kawachiya | G06F 9/522 718/100 |
| 2009/0119089 A1* | 5/2009 | Gheith | G06F 9/45537 703/23 |
| 2011/0145798 A1* | 6/2011 | Taillefer | G06F 11/362 717/129 |
| 2011/0258421 A1* | 10/2011 | Elnozahy | G06F 11/3636 712/227 |
| 2012/0204062 A1* | 8/2012 | Erickson | G06F 11/3636 714/35 |
| 2014/0163945 A1 | 6/2014 | Bashore et al. | |
| 2015/0356221 A1 | 12/2015 | Bashore et al. | |

OTHER PUBLICATIONS

Notice of Allowance in U.S. Appl. No. 13/707,812 dated Jan. 12, 2016, 10 pages (pp. 1-10 in pdf).

Office Action in U.S. Appl. No. 14/828,626 dated Aug. 18, 2015, 12 pages (pp. 1-12 in pdf).

Notice of Allowance in U.S. Appl. No. 14/828,626 dated Jan. 4, 2016, 8 pages (pp. 1-8 in pdf).

* cited by examiner

MEMORY FRAME PROXY ARCHITECTURE FOR SYNCHRONIZATION AND CHECK HANDLING IN A SIMULATOR

The present application is a Continuation of U.S. patent application Ser. No. 13/707,812, filed on Dec. 7, 2012, published as U.S. Patent Publication No. 20140163945-A1 on Jun. 12, 2014, and claims priority thereto under 35 U.S.C. § 120. The disclosure of the above-referenced parent U.S. patent application is incorporated herein by reference.

BACKGROUND OF THE INVENTION

Description of Related Art

Simulators, debuggers and accelerators that can be implemented in hardware, software or a combination of both, are typically are used in verification of program code as well as verification of designs of processor integrated circuits (ICs) and other large-scale logic.

In simulation using a multi-threaded simulator, the handling of memory accesses is complicated, as hardware mechanisms that are provided to avoid memory access conflicts are not actually present in the simulator, and thus the simulator must handle memory accesses made during the simulation in a synchronized manner, which reduces simulation throughput. Further, debug facilities such as breakpoints, watches and protection exceptions are often set for memory locations or memory ranges, requiring the simulator to perform those checks in the simulation environment.

Therefore, it would be desirable to provide a mechanism for managing accesses to memory that improves simulation throughput while synchronizing accesses and providing breakpoint, watch and protection capability for the simulator.

BRIEF SUMMARY OF THE INVENTION

The invention is embodied in a computer system and computer program product that simulate accesses to a simulated memory. The computer system is a computer system executing program instructions for carrying out a simulation, and the computer program product is a simulator program.

The simulation manages accesses to a frame of memory by using proxy frames to receive accesses to memory frames of a memory subsystem. Check frames can be inserted between the proxy frame and the memory frames, which if present, pre-process the accesses to the memory frames. If a check frame is not present for the accessed frame, the memory frame handles the request received from the proxy frame. The check frames can track write accesses to memory so that dirty frames can be tracked. The check frame may be a synchronization frame that stalls accesses from other simulator threads in a multi-threaded simulation environment. Other check frames may be chained between the proxy object and the memory frame to handle memory synchronization, breakpoints, memory watches, protections or for tracking accesses to the memory for other applications.

The foregoing and other objectives, features, and advantages of the invention will be apparent from the following, more particular, description of the preferred embodiment of the invention, as illustrated in the accompanying drawings.

BRIEF DESCRIPTION OF THE SEVERAL VIEWS OF THE DRAWING

The novel features believed characteristic of the invention are set forth in the appended claims. The invention itself, however, as well as a preferred mode of use, further objectives, and advantages thereof, will best be understood by reference to the following detailed description of the invention when read in conjunction with the accompanying Figures, wherein like reference numerals indicate like components, and:

DETAILED DESCRIPTION OF THE INVENTION

The present invention encompasses computer-performed simulations and programs for managing accesses to memory in simulated processing systems. Accesses to memory frames are made from corresponding proxy frames, which are objects having an interface for handling the accesses to the memory frames. A check frame may be inserted between the proxy frame and the memory interface and the simulated memory subsystem that contains the memory location. For the purposes of illustration, it can be assumed the frame size and the page size of the system being simulated are the same, but different frame sizes can be used in an actual implementation.

The proxy frame is generally allocated when the memory frame is referenced and de-allocated when all of the references to the memory frame no longer exist. Multiple check frames may be inserted for a given frame, the arrangement of which is maintained via the linked list. Functions such as synchronization between simulator and/or simulated threads, breakpoints, memory watches and dirty page management can be implemented and easily inserted and removed by inserting independent check frames corresponding to those functions.

Figure 1:
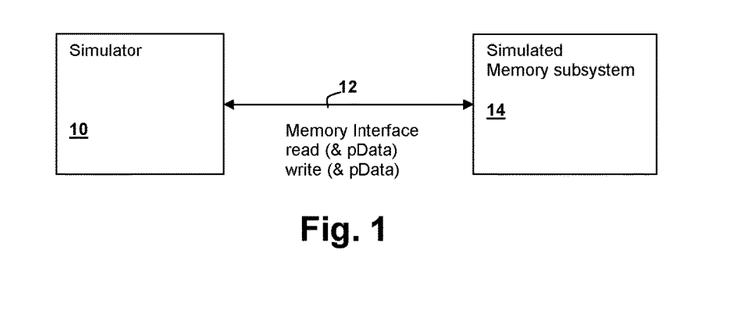
FIG. 1 is a pictorial diagram depicting a simulation architecture in which the techniques disclosed herein can be practiced in accordance with embodiments of the invention.

Referring now to FIG. 1, a simulation architecture is shown, in which techniques according to embodiments of the invention can be practiced. A simulator 10, i.e., a simulation program, implements a memory interface 12, through which a simulated memory subsystem 14 is accessed. Simulated memory subsystem 14 is generally data memory controlled by simulator 10 that contains stored values that represent the contents of memory that is being simulated along with one or more simulated processors that access the memory. The simulated memory may be data and/or code memory. Memory interface 12 is illustrated as a read( ) and write( ) interface that corresponds to load and store instructions, respectively, that are executed by the simulated processor. In the present invention, as will be illustrated in further detail below, for memory frames that require a check, a proxy frame handles the requests from memory interface 12 at simulated memory subsystem 14, so that synchronization between multiple simulation threads, breakpoints, watches, protection and other mechanisms that require special handling can be implemented for particular frames of memory. Each frame of memory simulated by simulated memory subsystem 14 that has a check set or one or more memory locations has an associated proxy frame and may have one or more check frames chained between the proxy frame and the memory frame. Memory frames that do not have an associated check are referenced directly. The frames of memory generally correspond to memory pages in the simulated system, but that may be alternatively larger or smaller than a page. The per-frame application of proxy frames and insertion of check frames provides direct access for frames that have no special handling, so that throughput is maximized, because no special checks are required to determine if special handling is required for that memory frame.

Figure 2A:
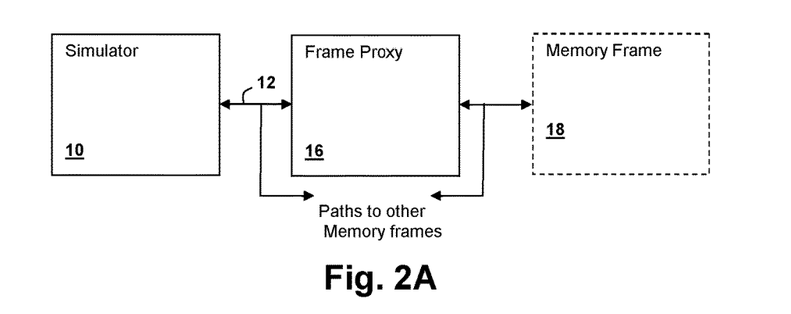
FIG. 2A and FIG. 2B are pictorial diagrams of simulated or actual memory access paths in the simulation architecture of FIG. 1.
Figure 2B:
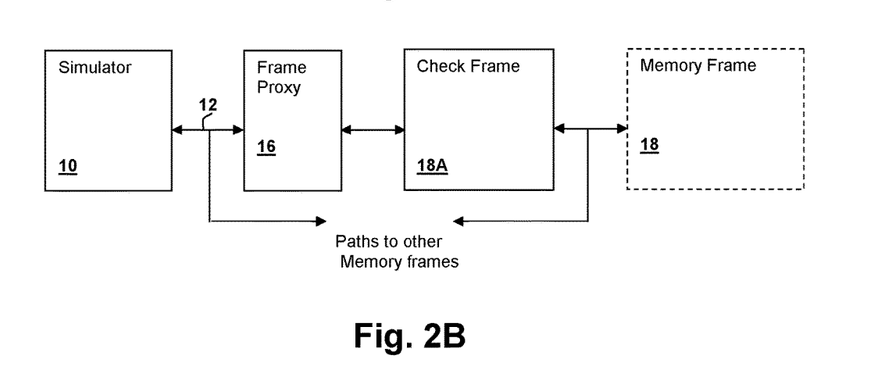

Referring now to FIG. 2A, a simulated memory access path for a memory frame within the simulation environment of FIG. 1 is shown. In the Figure, simulator 10 is illustrated as accessing frame proxy 16 through memory interface 12. Frame proxy 16 receives requests for access to a particular memory frame 18 of simulated memory subsystem 14 and handles the access to memory frame 18. FIG. 2A shows the access path when no checks are present for any location within memory frame 18. FIG. 2B shows an access path for memory frame 18 for which a check frame 18A has been inserted between frame proxy 16 and memory frame 18. Frame proxy 16 receives access requests from simulator 10, which passes the access on to check frame 18A, which performs special handling for the frame, e.g., simulator synchronization, simulated thread synchronization, breakpoint, watch or exception handling, or other special processing. Check frame 18A then passes the access request to the next frame in the linked list, which in the depicted example is memory frame 18. Any number of check frames 18A can be inserted to perform special processing, since each frame contains a pointer to the next frame in the list, ending with memory frame 18. In each of the cases shown in FIG. 2A and FIG. 2B, access to simulated memory subsystem 14 may or may not be required, since one of the inserted proxy frames may prevent access to the requested memory location, depending on what type of special operations are required by the check frames ahead of memory frame 18 in the linked list formed by the frames.

Figure 3:
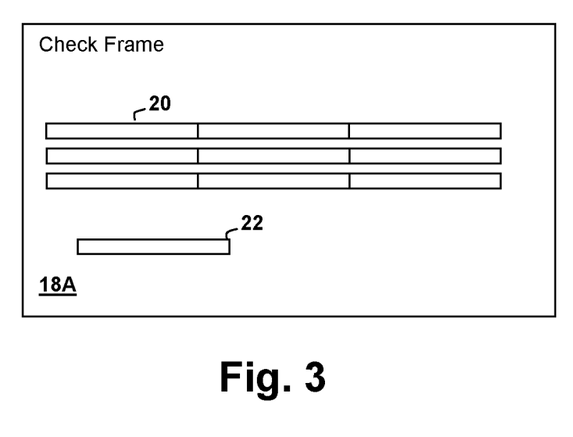
FIG. 3 is a pictorial diagram depicting on example of check frame 16A of FIG. 2B.

Referring now to FIG. 3, an architecture of check frame 18A of FIG. 2B is shown in accordance with an embodiment of the present invention. Check frame 18A contains a table 20 with at least one special handling entry of the form as given below in Table I:

TABLE I

| Location | Type | |
|---|---|---|
| | Reservation Frame | |
| | Trap Frame | &Spinlock |
| Address 1 | Breakpoint | &breakpoint_handler |
| Address 2 | Watch | &watch_handler |
| Address 3 | Exception | &exception_handler |
| | Mark Dirty Frame | |
| | Zero Frame (or init value frame) | (init_value) |
| | Swap Frame | &Spinlock |

The types of check frames illustrated in Table I are generally individual frames placed in the chain of linked frames for each given check, but alternatively, check frames may contain multiple checks, for example, a single breakpoint, watch or exception frame could be used to store breakpoint, watch or exception entries for multiple storage locations. The reservation frame is a frame placed in a chain to indicate that a thread being simulated has placed a reservation on one or more memory locations within the memory frame, e.g., a cache line. If another simulated thread attempts to write to a location within the reserved memory, the reservation is lost, providing support for simulating atomic operations, such as those implemented by POWER PC processors (POWER PC is a trademark of International Business Machines Corporation). A trap frame is a frame placed in front of the memory frame during simulation while a simulation thread is accessing the memory frame. If another simulation thread attempts to access the memory frame, the trap frame automatically receives the access. Further details of the use of reservation and trap frames will be illustrated below with reference to FIGS. 4A-4C. Breakpoint, watch and exception check frames call corresponding handlers, or trigger corresponding events, when a location (or alternatively a range of memory locations) in the frame are accessed in a request. A mark dirty frame can be inserted on a first write to a location within a frame, so that checks on the dirty bit and setting of the dirty bit do not have to be performed for each subsequent memory write to locations within the frame. A zero frame (or initial value frame) indicates that the memory frame has been initialized with zero (or init_value), and thus zero (or init_value) can be returned on a read access, without requiring access to the underlying memory frame. A swap frame is used in a special form of the synchronization implemented with the reservation frame, and will be discussed in further detail below with reference to FIGS. 5A-5C. Check frame 18A further contains a next object pointer 22 The value stored in next object pointer 22 can be placed in an upstream object's next object pointer when check frame 18A is removed from the chain of check frames, since the chain of check frames forms a linked list with next object pointer 22 providing the links. The above is only an example of a data structure that can be used within proxy frame to represent special handling operations and other forms of information that can provide some or all of the above-described capabilities. The data structure described above can alternatively be implemented by check frame 18A.

Figure 4A:
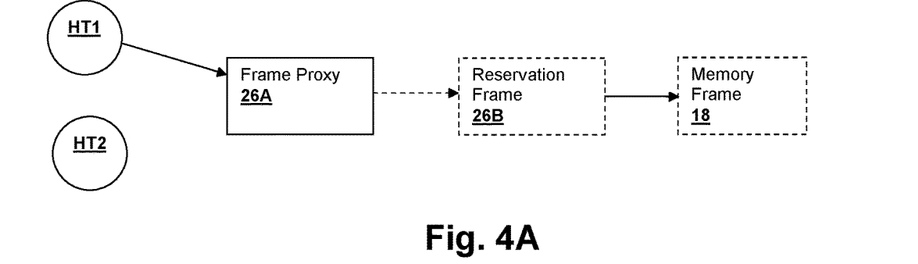
FIGS. 4A-4C are pictorial diagrams depicting a sequence of steps in a method of synchronization in accordance with an embodiment of the present invention.
Figure 4B:
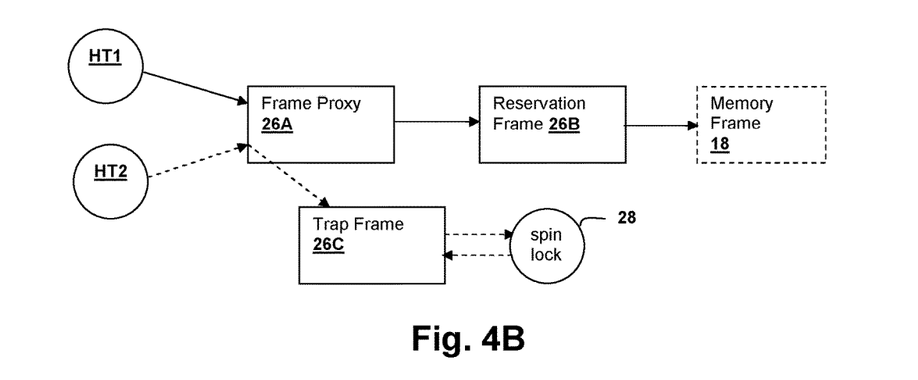
Figure 4C:
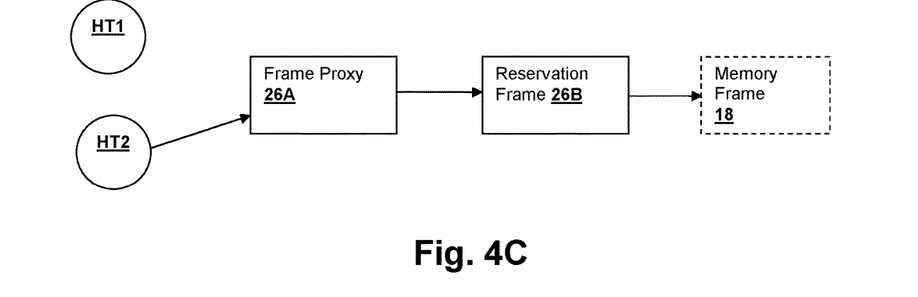

Referring now to FIGS. 4A-4C, a synchronization process in accordance with an embodiment of the present invention is shown. FIGS. 4A-4C illustrate a progression through time as various events in potentially conflicting accesses by two simulator threads HT1 and HT2 are received at the same frame proxy 26A. In FIG. 4A, frame proxy 26A receives a reservation request for a thread simulated by simulator thread HT1. The request causes a reservation frame 26B to be created. Reservation frame is inserted after frame proxy 26A and is maintained unless another simulated thread writes to the corresponding memory frame, which will cause a loss of the reservation and reservation frame 26B will be removed. If another simulator thread HT2 attempts to simulate an access to the memory frame while reserved frame is being accessed by the simulated thread that placed the reservation, frame proxy 26A sends the request to a trap frame 26C instead of sending the request onward to the underlying memory frame. Frame proxy 26A accomplishes this diversion by setting the head of the frame chain to point to trap frame 26C. Simulator thread HT2, which has entered trap frame 26C, waits on a spinlock 28 that has been initialized by frame proxy 26A. In the wait loop for spinlock 28, trap frame 26C compares the pointer at the head of the frame proxy 26A to its own pointer. As illustrated by FIG. 4C, Spinlock 28 is released once frame proxy 26A receives the response to the access by the simulated thread that placed the reservation. In response to completing the access, frame proxy 26A removes trap frame 26C from the head of the frame chain, which is, in turn, detected by the wait loop for spinlock 28 as described above. Frame proxy 26A sets the head of the frame chain to point again to reservation frame 26B which remains in place until the reservation is lost or otherwise removed.

Figure 5A:
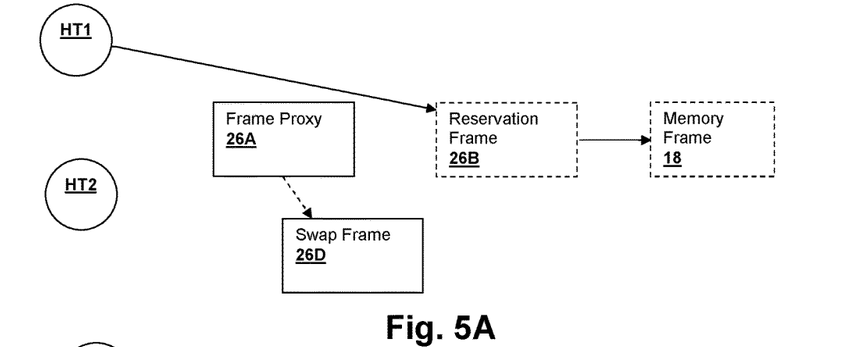
FIGS. 5A-5C are pictorial diagrams depicting a sequence of steps in a method of synchronization in accordance with another embodiment of the present invention.
Figure 5B:
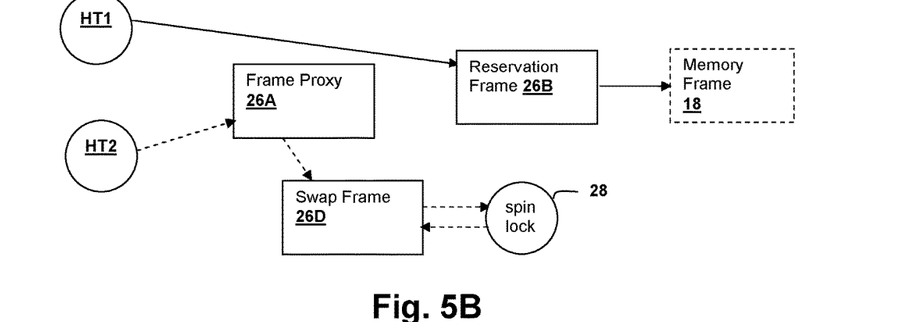
Figure 5C:
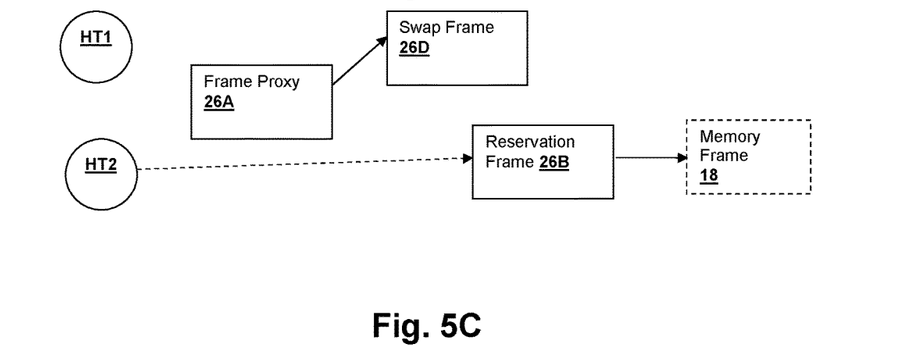

Referring now to FIGS. 5A-5C, a synchronization process in accordance with another embodiment of the present invention is shown. FIGS. 5A-5C illustrate a progression through time as various events in potentially conflicting accesses by two host threads HT1 and HT2 are received at the same frame proxy 26A. The depicted process reduces locking/unlocking overhead that occurs, for example, when a single thread repeatedly accesses a memory frame chain that implements the process illustrated in FIGS. 4A-4C. As in FIG. 4A, in FIG. 5A, frame proxy 26A receives a reservation request in response to a simulation being carried out by simulator thread HT1. The reservation request causes a reservation frame 26B to be created and inserted in the frame chain. Frame proxy 26A also creates a swap frame 26D and inserts swap frame 26D at the head of the linked-list forming the frame chain, to prevent other simulator threads, e.g., simulator thread HT2, from simulating access to the same memory frame while program code simulated by simulator thread HT1 is still accessing the memory frame. The presence of swap frame 26D indicates to other threads that thread HT1 is holding a lock on an access to the memory frame and might not be able to release the memory frame. At the end of each access to the memory frame, thread HT1 retains the pointer to the head of the actual frame chain, i.e., a pointer to reservation frame 26B, so that subsequent accesses can be performed directly through the frame chain beginning at reservation frame 26B. Then, as illustrated in FIG. 5B, eventually program code simulated by simulator thread HT2 attempts to access the memory frame via frame proxy 26A. The access is passed to swap frame 26D, which waits on a spinlock 28 that remains locked until release of the frame chain by the thread(s) simulated by simulator thread HT1. At the same time, simulator thread HT1 is sent a request to release the frame chain. As with the trap frame spinlock in FIGS. 4A-4C, swap frame 26D compares the pointer at the head of the frame chain to itself to determine whether simulator thread HT1 has caused frame proxy 26A to release the frame chain. Next, as shown in FIG. 5C, once the frame chain is released, frame proxy 26A provides the pointer to reservation frame 26B to thread HT2 and also maintains swap frame 26D at the head of the frame chain, so that another simulator thread cannot obtain access to the memory frame. The synchronization process illustrated in FIGS. 5A-5C is an alternative to that of FIGS. 4A-4C and a system could determine which process to use via metrics, for example, measuring the number of sequential simulated accesses by a given simulator thread versus simulated accesses by alternating simulator threads.

Figure 6:
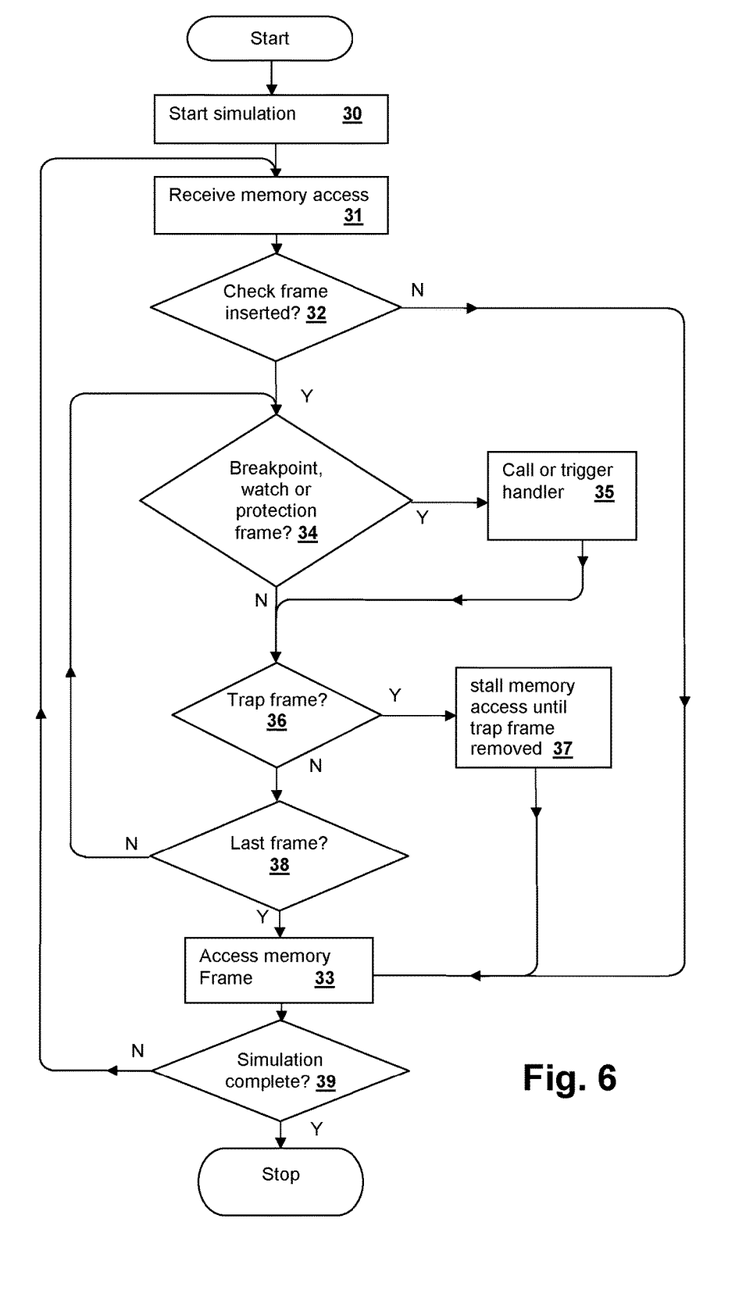
FIG. 6 is a flowchart depicting a method of managing memory access in accordance with an embodiment of the present invention.

Referring now to FIG. 6, a method of simulating accesses in accordance with an embodiment of the invention is exemplified. The simulation is started (step 30) and when a memory access is received (step 31), if a check frame is not inserted ahead of the corresponding memory frame (decision 32), then the value is accessed in memory via the memory frame (step 33). If there was no check frame inserted ahead of the memory frame (decision 32), until the simulation is complete (decision 41), steps 31-38 are repeated for subsequent memory accesses. If a check frame was inserted for the accessed frame (decision 32), then if the check frame contains a breakpoint, watch or protection entry (decision 34), the handler is called or triggered (step 35). If the check frame is a trap frame (decision 36), the access is stalled until the trap frame is removed (step 37). Until the last check frame in the chain (linked list) is encountered (decision 38), steps 34-38 are repeated, and steps 31-39 are repeated until the simulation is complete. While the zero (or init_value) check frame handling is not shown in FIG. 6, a zero frame should generally be inserted last in the chain before the memory frame itself and accessed instead of the memory frame at step 33, so that other checks can be performed ahead of returning the zero (or initial) value.

Figure 7:
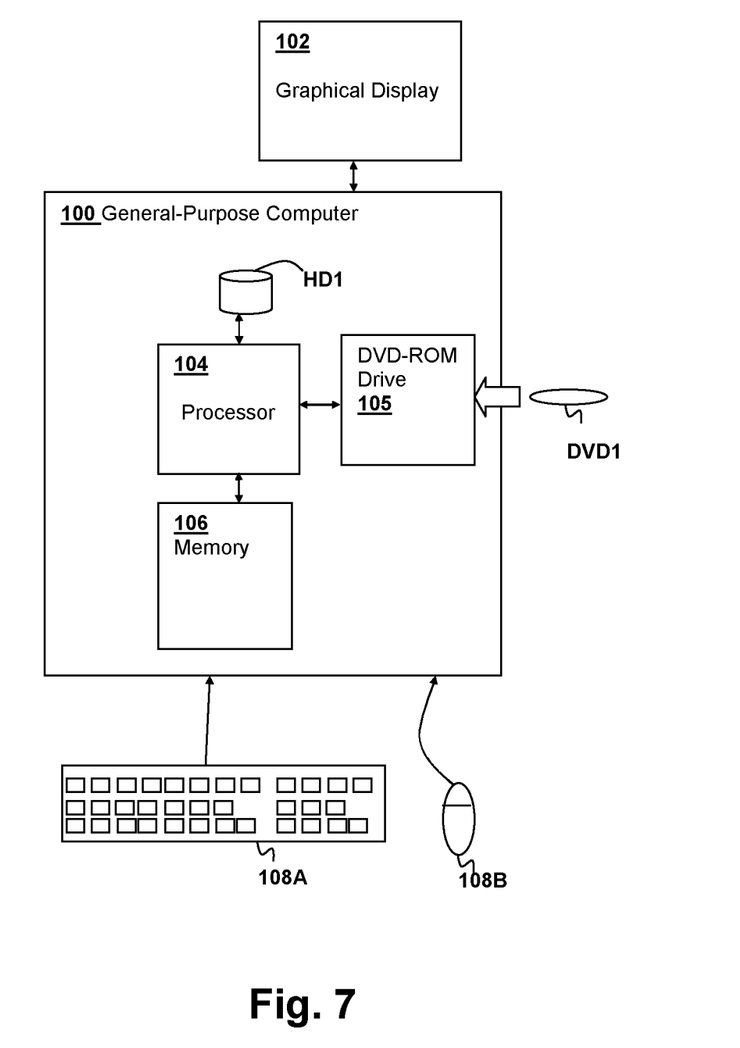
FIG. 7 is a block diagram illustrating a computer system in which program code according to an embodiment of the present invention implementing a method according to an embodiment of the invention is executed.

Referring now to FIG. 7, a computer system in which the above-described computer-performed methods are performed, is shown. A general-purpose computer 100 is coupled to a graphical display 102 for display of simulation results, as well as user interface screens for controlling one or more programs. The programs include programs forming computer program products including program instructions for carrying out the methods described above. Input devices such as a keyboard 108A and a mouse 108B provide for user interaction with general-purpose computer 100. General-purpose computer 100 includes a processor 104 for executing program instructions stored in a memory 106 including program instructions forming the above-described computer program products in accordance with embodiments of the invention. A removable storage device, such as a DVD-ROM drive 105 is included for accepting storage media such as DVD-ROM DVD1 forming a computer program product in accordance with an embodiment of the invention. The computer system depicted in FIG. 7 is only one example of a computer system, such as a desktop computer system, or a notebook computer system, that can be used to perform the simulations described above. Other types of computer systems, including distributed and networked computer systems in which some or all of the algorithms and portions thereof are executed remotely, are within the scope of the invention as contemplated herein. The system depicted in FIG. 7 should not be construed as limiting the type of computer system or computer program products that form embodiments of the present invention.

As noted above, portions of the present invention may be embodied in a computer program product, which may include firmware, an image in system memory or another memory/cache, or stored on a fixed or re-writable media such as an optical disc having computer-readable code stored thereon. Any combination of one or more computer-readable medium(s) may store a program in accordance with an embodiment of the invention. The computer-readable medium may be a computer-readable signal medium or a computer-readable storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

In the context of the present application, a computer-readable storage medium may be any tangible medium that can contain, or store a program for use by or in connection with an instruction execution system, apparatus, or device. A computer-readable signal medium may include a propagated data signal with computer-readable program code embodied therein, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device. Program code embodied on a computer-readable medium may be transmitted using any appropriate medium, including but not limited to wireless, wireline, optical fiber cable, RF, etc., or any suitable combination of the foregoing.

While the invention has been particularly shown and described with reference to the preferred embodiments thereof, it will be understood by those skilled in the art that the foregoing and other changes in form, and details may be made therein without departing from the spirit and scope of the invention.

The invention claimed is:

1. A computer system comprising a processor for executing program instructions coupled to a memory for storing the program instructions, wherein the program instructions are program instructions for simulating accesses to a simulated memory by a simulated processor, and wherein the program instructions comprise:
   program instructions for receiving a simulated request to access a memory location within a memory frame of the memory of the simulated computer system at a proxy frame corresponding to the memory frame, wherein the memory frame represents a tail of a linked list accessed via the proxy frame, wherein the memory frame handles simulated accesses to the memory of the simulated computer system after the tail of the linked list has been reached, and wherein the linked list stores an ordered arrangement of one or more check frames extending from the proxy frame to the memory frame, wherein if the memory frame is further at the head of the linked list the one or more check frames are not present;
   program instructions for, responsive to the one or more check frames being present in the linked list ahead of the memory frame, processing the access request by the one or more check frames in the order of the ordered arrangement, wherein the one or more check frames perform a corresponding one or more checks on the access request; and
   program instructions for, responsive to the one or more check frames not being present in the linked list ahead of the memory frame, processing the access request by the memory frame directly, whereby the simulated accesses are processed without a delay due to performing a check on the access request, thereby improving the throughput of the simulated memory.

2. The computer system of claim 1, wherein the one or more check frames include a reservation frame inserted on behalf of a simulated thread, and wherein the proxy frame removes the reservation frame if another simulated thread writes to the memory frame.

3. The computer system of claim 2, wherein the one or more check frames include a trap frame placed at the head of the linked list by the proxy frame to block access to the memory frame by other simulator threads while the memory frame is accessed directly by a thread simulated by a first simulator thread.

4. The computer system of claim 3, wherein the program instructions for processing the access request trap frame periodically examines the head of the linked list to determine whether the trap frame has been removed from the head of the linked list, in order to determine when to unblock the access.

5. The computer system of claim 1, wherein the one or more check frames include a zero frame, and wherein the program instructions for processing the access request complete the access request by returning a zero value without passing the access request to the memory frame.

6. The computer system of claim 1, wherein the one or more check frames include a breakpoint frame or watch frame, and wherein the program instructions for processing the access request generate a breakpoint notification or watch update in response to the access request.

7. A computer program product comprising a computer-readable storage device that is not a signal or carrier wave, the computer-readable storage device storing program instructions for simulating accesses to memory by a simulated processor, when executed by a computer system, wherein the program instructions comprise program instructions for:
   program instructions for receiving a simulated request to access a memory location within a memory frame of the memory of the simulated computer system at a proxy frame corresponding to the memory frame, wherein the memory frame represents a tail of a linked list accessed via the proxy frame, wherein the memory frame handles simulated accesses to the memory of the simulated computer system after the tail of the linked list has been reached, and wherein the linked list stores an ordered arrangement of one or more check frames extending from the proxy frame to the memory frame, wherein if the memory frame is further at the head of the linked list the one or more check frames are not present;
   program instructions for, responsive to the one or more check frame s being present in the linked list ahead of the memory frame, processing the access request by the one or more check frames in the order of the ordered arrangement, wherein the one or more check frames perform a corresponding one or more checks on the access request; and
   program instructions for, responsive to the one or more check frames not being present in the linked list ahead of the memory frame, processing the access request by the memory frame directly, whereby the simulated accesses are processed without a delay due to performing a check on the access request, thereby improving the throughput of the simulated memory.

8. The computer program product of claim 7, wherein the one or more check frames include a reservation frame inserted on behalf of a simulated thread, and wherein the proxy frame removes the reservation frame if another simulated thread writes to the memory frame.

9. The computer program product of claim 7, wherein the one or more check frames include a trap frame placed at the head of the linked list by the proxy frame to block access to the memory frame by other simulator threads while the memory frame is accessed directly by a thread simulated by a first simulator thread.

10. The computer program product of claim 9, wherein the program instructions for processing the access request trap frame periodically examines the head of the linked list to determine whether the trap frame has been removed from the head of the linked list, in order to determine when to unblock the access.

11. The computer program product of claim 7, wherein the one or more check frames include a zero frame, and wherein the program instructions for processing the access request complete the access request by returning a zero value without passing the access request to the memory frame.

12. The computer program product of claim 7, wherein the one or more check frames include a breakpoint frame or watch frame, and wherein the program instructions for processing the access request generate a breakpoint notification or watch update in response to the access request.

* * * * *